United States Patent
Nozaki

(10) Patent No.: US 7,696,753 B2
(45) Date of Patent: Apr. 13, 2010

(54) MRI APPARATUS AND METHOD WITH $B_0$ CORRECTIONS USING REFERENCE AND OBJECT AVERAGE UNITS

(75) Inventor: Seiji Nozaki, Otawara (JP)

(73) Assignees: Kabushiki Kaisha Toshiba, Minato-ku, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 0 days.

(21) Appl. No.: 12/155,212

(22) Filed: May 30, 2008

(65) Prior Publication Data

US 2008/0297153 A1    Dec. 4, 2008

(30) Foreign Application Priority Data

May 31, 2007    (JP)    ............................. 2007-145513

(51) Int. Cl.
*G01V 3/00*    (2006.01)
(52) U.S. Cl. ..................................................... 324/307
(58) Field of Classification Search ......... 324/300–322; 600/410–435
See application file for complete search history.

(56) References Cited

U.S. PATENT DOCUMENTS

| | | | | |
|---|---|---|---|---|
| 4,885,542 A | * | 12/1989 | Yao et al. ..................... 324/313 |
| 4,937,526 A | * | 6/1990 | Ehman et al. ................ 324/309 |
| 5,636,636 A | * | 6/1997 | Kuhn et al. .................. 600/415 |
| 6,249,595 B1 | * | 6/2001 | Foxall et al. ................. 382/128 |
| 7,437,188 B2 | * | 10/2008 | Kruger et al. ............... 600/410 |

FOREIGN PATENT DOCUMENTS

JP    2005-270285    10/2005

* cited by examiner

*Primary Examiner*—Brij B Shrivastav
*Assistant Examiner*—Dixomara Vargas
(74) *Attorney, Agent, or Firm*—Nixon & Vanderhye PC

(57) ABSTRACT

Data is collected for average units including acquisition of template data and acquisition of imaging data. A frequency difference is calculated between a resonant frequency in a reference average unit and a resonant frequency of an object average unit based on phase variation of the magnetic field between the reference average unit and the object average unit. Corrected phase shift is produced in image data collected in one or more average units based on the frequency difference. An image is reconstructed based on the imaging data collected in the reference average unit and corrected imaging data concerning the object average unit constituted by one or more average units.

14 Claims, 7 Drawing Sheets

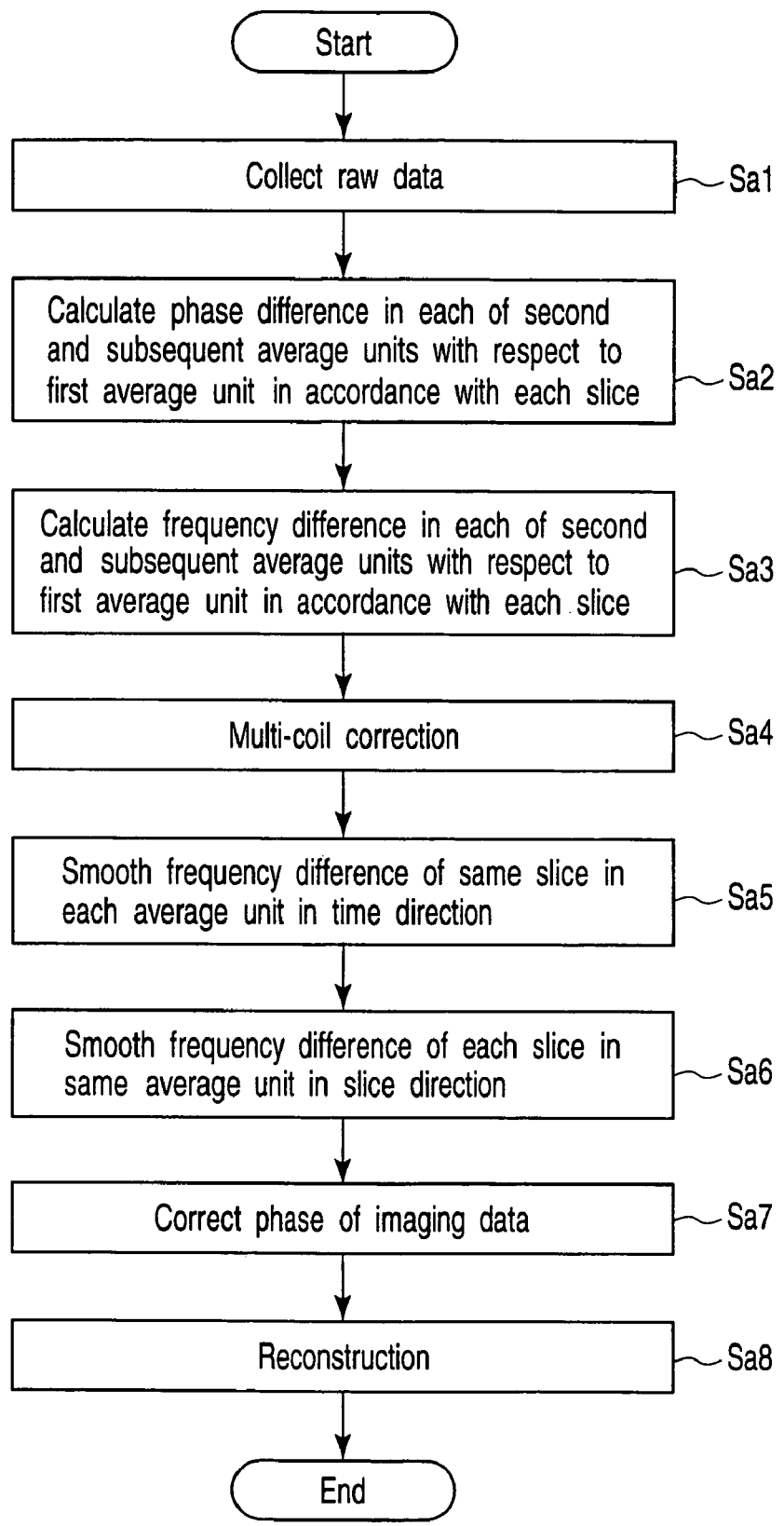
F I G. 3

MRI APPARATUS AND METHOD WITH $B_0$ CORRECTIONS USING REFERENCE AND OBJECT AVERAGE UNITS

CROSS-REFERENCE TO RELATED APPLICATIONS

This application is based upon and claims the benefit of priority from prior Japanese Patent Application No. 2007-145513, filed May 31, 2007, the entire contents of which are incorporated herein by reference.

BACKGROUND OF THE INVENTION

1. Field of the Invention

The present invention relates to a magnetic resonance imaging apparatus and a magnetic resonance imaging method that image a subject based on a magnetic resonance signal generated in the subject.

2. Description of the Related Art

In a magnetic resonance imaging apparatus that utilizes an iron shim to perform shimming, a static magnetic field intensity in an imaging region varies with a change in temperature of the iron shim. Such a variation in the static magnetic field intensity is called a $B_0$ shift. Since a resonant frequency also varies when the $B_0$ shift occurs, a displacement of a reconstructed image may possibly occur. Such a displacement prominently occurs in an echo planar imaging (EPI) sequence (an echo planar imaging sequence) having a high frequency resolution in a phase encoding (PE) direction.

In EPI type diffusion weighted imaging (DWI), since a load of a gradient coil is large because of application of an motion probing gradient (MPG) pulse, heat generation from the gradient magnetic field coil is large. Therefore, an increase in temperature of the iron shim during scanning is large, and the $B_0$ shift is also increased.

In order to avoid such an increase in the $B_0$ shift involved by heat generation from the gradient coil, a measure for preventing an increase in temperature of the iron shim has been conventionally taken. Since this measure is realized by arranging the iron shim to be apart from the gradient coil or intensively cooling the iron shim, there is a problem in cost.

Thus, for example, JP-A 2005-270285 (KOKAI) proposes a technology of reducing an influence of the $B_0$ shift without greatly modifying hardware, e.g., the iron shim.

However, the technology disclosed in JP-A 2005-270285 (KOKAI) is premised on a case where dynamic imaging using a field echo type EPI sequence (an FE-EPI sequence) is performed. Therefore, the technology disclosed in JP-A 2005-270285 (KOKAI) cannot be applied to a different sequence such as a spin echo type EPI sequence (an SE-EPI sequence).

BRIEF SUMMARY OF THE INVENTION

Under the circumstances, reducing an influence of the $B_0$ shift in magnetic resonance imaging without greatly modifying hardware has been demanded.

According to a first aspect of the present invention, there is provided a magnetic resonance imaging apparatus that images a subject based on a magnetic resonance signal produced in the subject by applying a gradient magnetic field and a radio-frequency pulse to the subject in a static magnetic field, comprising: a collecting unit which collects data for a plurality of average units, each of the plurality of average units including acquisition of template data based on the magnetic resonance signal produced in the subject without performing phase encoding based on the gradient magnetic field, and acquisition of imaging data based on the magnetic resonance signal produced in the subject by performing the phase encoding; a calculating unit which calculates a frequency difference between a resonant frequency in a reference average unit and a resonant frequency of an object average unit based on a phase variation of the magnetic resonance signal in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; a correcting unit which corrects a phase shift in an applying direction of the phase encoding gradient magnetic field produced in image data collected in the object average unit constituted by one or more average units based on the frequency difference calculated in regard to the average unit; and a reconstructing unit which reconstructs an image concerning the subject based on the imaging data collected in the reference average unit and the imaging data concerning the object average unit constituted by one or more average units corrected by the correcting unit.

According to a second aspect of the present invention, there is provided a magnetic resonance imaging apparatus that images a subject based on a magnetic resonance signal produced in the subject by applying a gradient magnetic field and a radio-frequency pulse to the subject in a static magnetic field, comprising: a collecting unit which collects data for a plurality of average units, each of the plurality of average units including acquisition of template data based on the magnetic resonance signal produced in the subject without performing phase encoding based on the gradient magnetic field, and acquisition of imaging data based on the magnetic resonance signal produced in the subject by performing the phase encoding; a calculating unit which calculates a frequency difference between a resonant frequency in a reference average unit and a resonant frequency of an object average unit average unit based on a phase variation of the magnetic resonance signal in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; a correcting unit which corrects a center frequency of the excitation radio-frequency pulse that is applied to the subject to collect imaging data in the object average units based on the frequency difference calculated in the object average unit; and a unit which reconstructs an image concerning the subject based on the imaging data collected by the collecting unit.

According to a third aspect of the present invention, there is provided a magnetic resonance imaging apparatus that images a subject based on a spin echo type echo planar method of selectively exciting a nuclear spin within a slice by simultaneously applying an excitation radio-frequency pulse and a slice-selection gradient magnetic field to the subject, then applying a refocusing radio-frequency pulse, subsequently applying a read-out gradient magnetic field in a direction parallel to the slice while switching more than once, and simultaneously statically applying a phase encoding gradient magnetic field in a direction parallel to the slice-selection gradient magnetic field and perpendicular to the read-out gradient magnetic field, the apparatus comprising: a collecting unit which collects data for a plurality of average units, each of the plurality of average units including collection of template data of the slice based on a magnetic resonance signal emitted from the subject without applying the phase encoding gradient magnetic field and without application of a motion probing gradient pulse, and collection of imaging data of the slice based on a magnetic resonance signal emitted from the subject by applying the phase encoding gradient magnetic field; a calculating unit which calculates a frequency difference between a resonant frequency in a reference average unit and a resonant frequency of an object average unit based on a phase variation of the magnetic resonance signal in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; a correcting unit which corrects a phase shift produced in image data collected in the object average unit constituted by one or more average units in an applying direction of the phase encoding gradient magnetic field based on the frequency difference calculated in the regard to the average unit; and a reconstructing unit which reconstructs an image concerning the subject based on the imaging data collected in the reference average unit and the imaging data concerning the object average unit constituted by one or more average units corrected by the correcting unit.

According to a fourth aspect of the present invention, there is provided a magnetic resonance imaging apparatus that images a subject based on a spin echo type echo planar method of selectively exciting a nuclear spin within a slice by simultaneously applying an excitation radio-frequency pulse and a slice-selection gradient magnetic field to the subject, then applying a refocusing radio-frequency pulse, subsequently applying a read-out gradient magnetic field in a direction parallel to the slice while switching more than once, and simultaneously statistically applying a phase encoding gradient magnetic field in a direction parallel to the slice-selection gradient magnetic field and perpendicular to the read-out gradient magnetic field, the apparatus comprising: collecting unit which collects data for a plurality of average units, each of the plurality of average units including collection of template data of the slice based on a magnetic resonance signal emitted from the subject without applying the phase encoding gradient magnetic field and without application of a motion probing gradient pulse, and collection of imaging data of the slice based on a magnetic resonance signal emitted from the subject by applying the phase encoding gradient magnetic field; a calculating unit which calculates a frequency difference between a resonant frequency in a reference average unit and a resonant frequency of an object average unit based on a phase variation of the magnetic resonance signal in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; a correcting unit which corrects a center frequency of the excitation radio-frequency pulse that is applied to the subject for collection of the imaging data in the object average units based on the frequency difference calculated in regard to the object average unit; and a unit which reconstructs an image concerning the subject based on the imaging data collected by the collecting means.

According to a fifth aspect of the present invention, there is provided a magnetic resonance imaging method of imaging a subject based on a magnetic resonance signal produced in the subject by applying a gradient magnetic field and a radio-frequency pulse to the subject in a static magnetic field, the method comprising: collecting data for a plurality of average units, each of the plurality of average units including acquisition of template data based on the magnetic resonance signal produced in the subject without performing phase encoding based on the gradient magnetic field, and acquisition of imaging data based on the magnetic resonance signal produced in the subject by performing the phase encoding; calculating a frequency difference between a resonant frequency in a reference average unit and a resonant frequency of an object average unit based on a phase variation of the magnetic field in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; correcting a phase shift produced in image data collected in the object average unit constituted by one or more average units in an applying direction of the phase encoding gradient magnetic field based on the frequency difference calculated in the object average units; and reconstructing an image concerning the subject based on the imaging data collected in the reference average unit and the corrected imaging data concerning the object average unit constituted by one or more average units.

According to a sixth aspect of the present invention, there is provided a magnetic resonance imaging method of imaging a subject based on a magnetic resonance signal produced in the subject by applying a gradient magnetic field and a radio-frequency pulse to the subject in a static magnetic field, the method comprising: collecting data for a plurality of average units, each of the plurality of average units including acquisition of template data based on the magnetic resonance signal produced in the subject without performing phase encoding based on the gradient magnetic field, and acquisition of imaging data based on the magnetic resonance signal produced in the subject by performing the phase encoding; calculating a frequency difference between a resonant frequency in a reference average unit and a resonant frequency of an object average unit based on a phase variation of the magnetic resonance signal in a period where the template data is collected in the reference average unit and a phase variation of the magnetic resonance signal in a period where the template data is collected in the object average unit, wherein in a case the average units are two, the reference average unit is one of the average units, and the object average unit is another one of the average units, and in a case where the average units are three or more, the reference average unit is one of the average units, and the object average unit is constituted by remaining ones of the average units; correcting a center frequency of the excitation radio-frequency pulse that is applied to the subject for collection of the imaging data in the object average units based on the frequency difference calculated in the object average unit; and reconstructing an image concerning the subject based on the imaging data collected by the collecting unit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

FIG. 3 is a flowchart of processing by a host computer depicted in FIG. 1 when performing DWI;

DETAILED DESCRIPTION OF THE INVENTION

Hereinafter, one embodiment of the present invention will be described with reference to the drawings.

Figure 1:
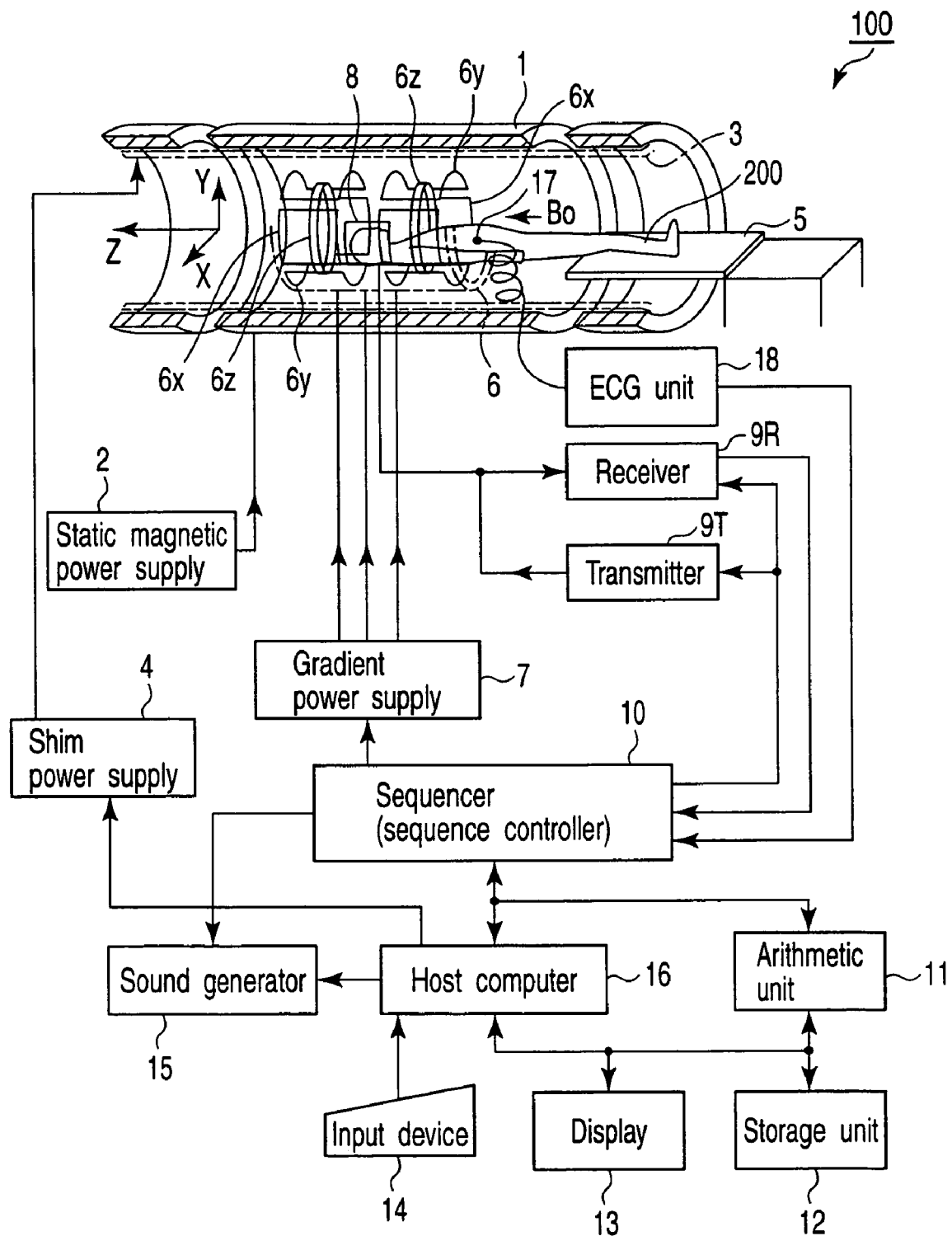
FIG. 1 is a view showing an outline structure of a magnetic resonance imaging apparatus (an MRI apparatus) according to an embodiment of the present invention.

FIG. 1 is a diagram showing the configuration of a magnetic resonance imaging apparatus 100 (hereinafter referred to as an MRI apparatus) according to the embodiments of this invention.

The MRI apparatus 100 comprises a bed unit, a static-magnetic-field generating unit, a gradient-magnetic-field generating unit, a receiving/transmitting unit, and a control/operating unit. A subject 200 may lie on the bed unit. The static-magnetic-field generating unit generates a static magnetic field. The gradient-magnetic-field generating unit is designed to add position information to the static magnetic field. The receiving/transmitting unit can receive and transmit a radio-frequency signal. The control/operating unit controls the other components of the system and reconstruct images. The MRI apparatus 100 has, as components of these units, a magnet 1, a static magnetic power supply 2, a shim coil 3, a shim power supply 4, a top plate 5, a gradient coil unit 6, a gradient power supply 7, an RF coil unit 8, a transmitter 9T, a receiver 9R, a sequencer (sequence controller) 10, an arithmetic unit 11, a storage unit 12, a display 13, an input device 14, an audio unit 15, and a host computer 16. To the MRI apparatus 100, an electrocardiograph unit is connected and detects an ECG signal representing the cardiac phase of the subject 200.

The static-magnetic-field generating unit includes the magnet 1 and the static magnetic power supply 2. The magnet 1 is, for example, a superconducting magnet or a normal magnet. The static magnetic power supply 2 supplies a current to the magnet 1. The static-magnetic-field generating unit therefore generates a static magnetic field B0 in a cylindrical aperture (examination space) into which the subject 200 is moved. The direction of the static magnetic field B0 virtually coincides with the axis (i.e., the Z-axis) of the examination space. The static-magnetic-field generating unit further includes the shim coil 3. The shim coil 3 generates a correction magnetic field for rendering the static magnetic field uniform when a current is supplied to it from the shim power supply 4 under the control of the host computer 16.

The bed unit moves the top plate 5, on which the subject 200 is lying, into or out of the examination space.

The gradient-magnetic-field generating unit includes the gradient coil unit 6 and the gradient power supply 7. The gradient coil unit 6 is arranged in the magnet 1. The gradient coil unit 6 has three coils 6x, 6y and 6z that can generate three gradient magnetic fields extending in mutually orthogonal X-, Y- and Z-axes, respectively. The gradient power supply 7 supplies pulse currents to the coils 6x, 6y and 6z, under the control of the sequencer 10. Supplied with the pulse current, the coils 6x, 6y and 6z generate gradient magnetic fields. The gradient-magnetic-field generating unit controls the pulse currents supplied from the gradient power supply 7 to the coils 6x, 6y and 6z. Thus, the gradient-magnetic-field generating unit synthesizes gradient magnetic fields extending in the three physical axes (i.e., the X-, Y- and Z-axes), respectively. The unit sets these magnetic fields in logical axes defined by a slice gradient magnetic field Gss, a phase-encode gradient magnetic field Gpe and a read-out (frequency-encode) gradient magnetic field Gro, respectively, which intersect at right angles with one another. The slice, phase-encode and read-out gradient magnetic fields, Gss, Gpe and Gro, are superposed on the static magnetic field B0.

The receiving/transmitting unit includes the RF coil unit 8, the transmitter 9T, and the receiver 9R. The RF coil unit 8 is arranged near the subject 200 in the examination space. The transmitter 9T and the receiver 9R are connected to the RF coil unit 8. The transmitter 9T and the receiver 9R operate under the control of the sequencer 10. The transmitter 9T supplies an RF current pulse of Larmor frequency to the RF coil unit 8 in order to induce nuclear magnetic resonance (NMR). The receiver 9R acquires an MR signal (radio-frequency signal), such as an echo signal, which the RF coil unit 8 has received. The receiver 9R then performs, on the MR signal, various processes, such as pre-amplification, intermediate-frequency conversion, phase detecting, low-frequency amplification and filtering. Finally, the receiver 9R performs analog-to-digital (A/D) conversion on the MR signal, producing digital data (raw data).

Figure 2:
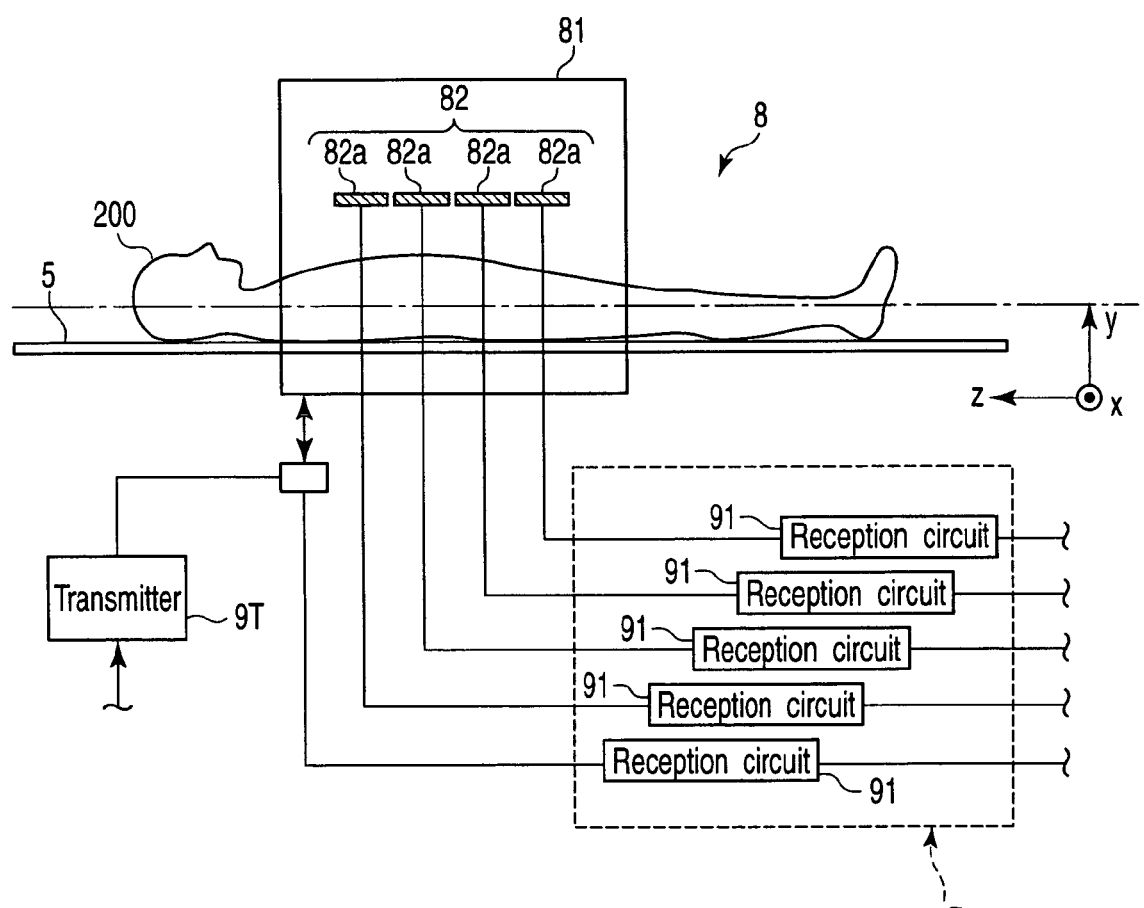
FIG. 2 is a view showing an example of detailed structures of an RF coil unit and a receiver depicted in FIG. 1.

FIG. 2 is a view showing an example of detailed structures of the RF coil unit 8 and the receiver 9R depicted in FIG. 1.

In the example shown in FIG. 2, the RF coil unit 8 includes a whole-body (WB) coil 81 and a phased array coil 82. The phased array coil 82 includes a plurality of surface coils 82a. The whole-body coil 81 is connected with both the transmitter 9T and the receiver 9R and used for both transmission of a radio-frequency signal and reception of a magnetic resonance signal. The plurality of surface coils 82a are connected with the receiver 9R, respectively. The receiver 9R includes a plurality of reception system circuits 91. The whole-body coil 81 and the plurality of surface coils 82a are individually connected with the reception system circuits 91. Each of the reception system circuits 91 generates the above-explained raw data.

However, the RF coil unit 8 may be formed of arbitrary coils suitable for various intended purposes or may be formed of the single coil.

The control/operating unit includes the sequencer 10, the arithmetic unit 11, the storage unit 12, the display 13, the input device 14, the audio unit 15 and the host computer 16.

The sequencer 10 has a CPU and a memory. The sequencer 10 receives pulse sequence information from the host computer 16. The pulse sequence information is stored into the memory. The CPU of the sequencer 10 controls the gradient power supply 7, transmitter 9T and receiver 9R in accordance with the sequence information stored in the memory. The CPU also receives the raw data output from the receiver 9R and transfers the raw data to the arithmetic unit 11. Note that the sequence information is all data necessary for operating the gradient power supply 7, transmitter 9T and receiver 9R in accordance with the pulse sequence. The sequence information includes information that realizes data collection for DWI based on the SE-EPI sequence by average scan.

According to the average scanning, a plurality of pieces of data concerning one slice are collected under the same conditions, and the plurality of pieces of obtained data are averaged to acquire data that reconstructs an image of the slice. It is to be noted that one in a plurality of number of times for data collection will be referred to as an average unit hereinafter.

The arithmetic unit 11 receives the raw data output from the transmitter 9T, through the sequencer 10. The arithmetic unit 11 has an internal memory. The internal memory has k-space (also known as Fourier space or frequency space), in which the raw data input to the arithmetic unit 11 is stored. The raw data is subjected to two- or three-dimensional Fourier transform, thereby reconstructing video data for the real space. The arithmetic unit 11 can perform, if necessary, synthesis and differential operation (including weighted differentiation) on any data representing an image. The synthesis includes cumulative addition of pixel values, maximum intensity projection (MIP), and the like. As another example of the synthesis, the axes of several frames may be aligned in a Fourier space, and the raw data items representing these frames may be synthesized, thereby generating one-frame raw data. The addition of pixel values may be simple addition, arithmetic-mean process or weighted-mean process.

The storage unit 12 stores video data reconstructed or video data subjected to the above-mentioned synthesis or differential operation.

The display 13 can display various images to the user, under the control of the host computer 16. The display 13 is, for example, a display device such as a liquid crystal display.

The input device 14 is operated to input various data items such as parameter information for synchronous timing selection, scanning conditions the operator desires, the pulse sequence, data about the image synthesis and differential operation, and the like. These data items are sent from the input device 14 to the host computer 16. The input device 14 comprises, as the case may be, a pointing device such as a mouse or a track ball, a section device such as a mode-switching panel, or a device such as keyboard.

The audio unit 15 generates messages for the start and end of breath holding as sounds under the control of the host computer 16.

The host computer 16 can perform various functions when a prescribed software routine is executed. One of these functions is to manage the units constituting the MRI apparatus 100 so that the apparatus 100 performs such various operations as the existing MRI apparatus performs. One of these functions is to instruct the pulse sequence information to the sequencer 10 and to control operations of the entire apparatus. One of these functions is to measure variations of phases of magnetic resonance signals at the start and the end of acquisition of template data in accordance with each average unit. One of these functions is to determine a phase difference between two average units that are adjacent to each other in execution order as a difference between the variations measured in the two average units. One of these functions is to calculate a frequency difference between resonant frequencies in the two average units based on the phase difference. One of these functions is to execute correction processing for reducing degradation in an image due to a change in the resonant frequencies based on the frequency difference.

The electrocardiograph unit includes an ECG sensor 17 and an ECG unit 18. The ECG sensor 17 may be attached to the subject 200 to detect an ECG signal from the subject 200. The ECG signal is an electrical signal (hereinafter referred to as a sensor signal). The ECG unit 18 performs various processes, including binary encoding, on the sensor signal. The sensor signal thus processed is output to the sequencer 10. The electrocardiograph unit is, for example, a vector electrocardiograph. The sequencer 10 uses the sensor signal generated by the electrocardiograph unit, when it is necessary to carry out a scan in synchronism with the cardiac phase of the subject 200.

An operation of the thus configured MRI apparatus 100 will now be explained.

The MRI apparatus 100 can perform average scan utilizing the SE-EPI sequence. FIG. 3 is a flowchart of processing by the host computer 16 when performing DWI utilizing the SE-EPI sequence.

In step Sa1, the host computer 16 instructs the sequencer 10 and the arithmetic unit 11 to collect raw data required for DWI based on average scan utilizing the SE-EPI sequence. In response to this instruction, the sequencer 10 collects raw data. The raw data collected by the sequencer 10 is stored in the internal memory in the arithmetic unit 11. Normally, the "raw data" refers to the MR signal itself. However, the "raw data" used herein refers to image data reconstructed based on the MR signal and not subjected to averaging.

Figure 4:
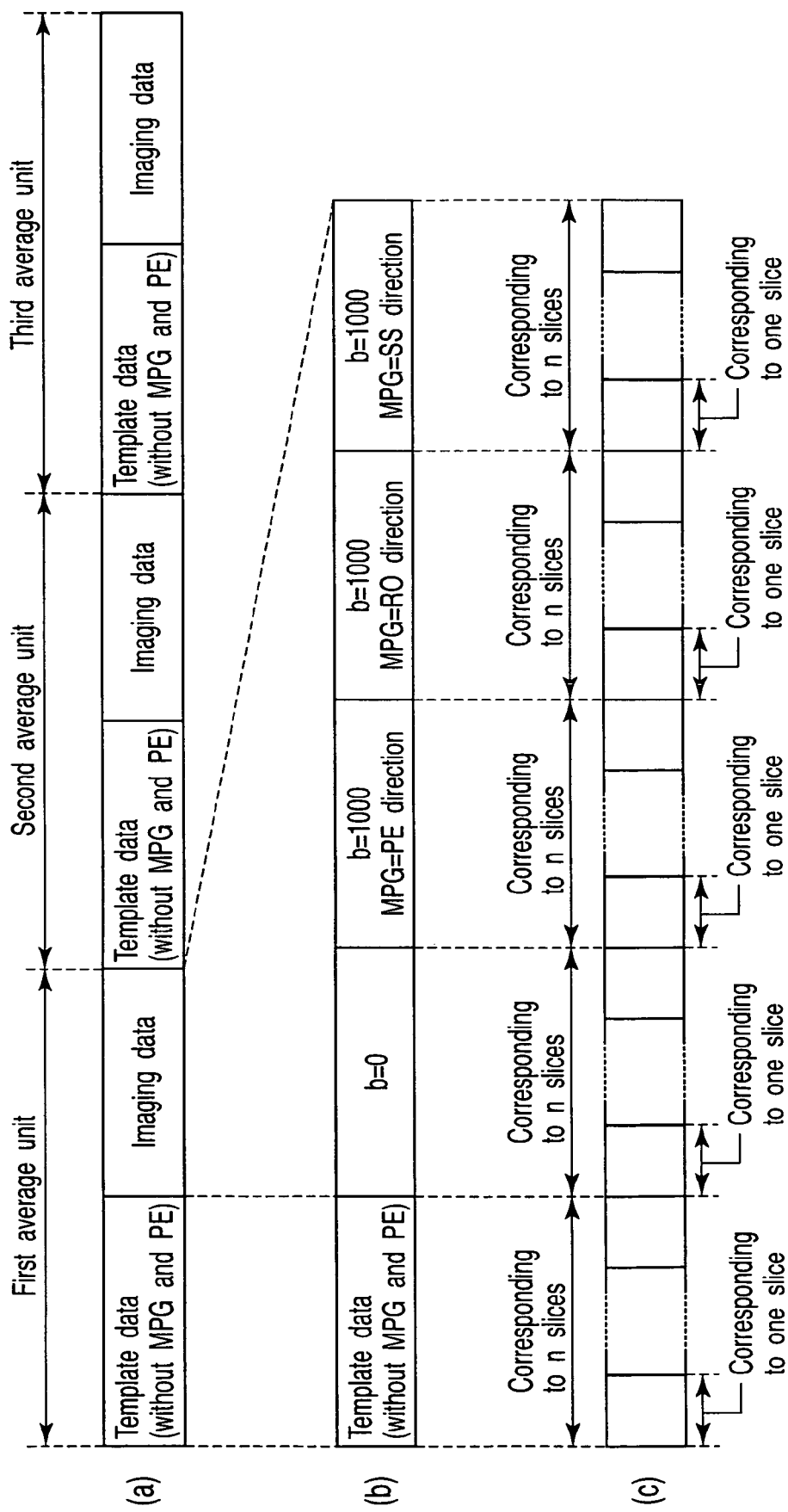
FIG. 4 is a timing chart showing an example of a procedure of collecting raw data in three average units.

FIG. 4 is a timing chart showing an example of a procedure of collecting the raw data in three average units.

As shown by a chart (a) in FIG. 4, template data and imaging data are collected in each of first to third average units. The template data is raw data that is generated without performing phase encoding. The imaging data is raw data that is generated by performing application of the MPG pulse and phase encoding. The imaging data includes a plurality of sets of raw data sequentially acquired while varying at least one of a magnitude of a b factor and a direction of the MPG pulse. That is, the application of the MPG pulse is performed for collection of the imaging data. However, the application of the MPG pulse is not performed for collection of the template data.

A chart (b) in FIG. 4 shows a procedure of data collection corresponding to one average in more detail. As shown by the chart (b) in FIG. 4, as the imaging data, raw data is first collected in a state where the b factor is set to "0". Then, the b factor is fixed to "1000", and three types of raw data are collected while varying the direction of the MPG pulse to each of phase-encode (PE) direction, read-out (RO) direction, and slice-selection (SS) direction.

Such average scan may be performed with respect to one slice only as a target, or it may be performed with respect to a plurality of slices as targets.

When one slice alone is a target, each block shown in the chart (b) in FIG. 4 corresponds to a collection period for raw data of one slice, and raw data of the same slice is collected in each period.

When a plurality of slices are targeted, template data and imaging data of each slice are collected in each average unit. At this time, each group of the imaging data includes raw data of each slice. That is, assuming that n is the number of slices as scan targets, raw data corresponding to n slices with the same conditions are continuously collected as shown by a chart (c) in FIG. 4. Therefore, raw data corresponding to n slices per average unit is collected as the template data. Further, assuming that such four types of raw data as shown by the chart (b) in FIG. 4 is collected as the image data, 4×n pieces of raw data are collected per average unit. It is to be noted that, if the plurality of surface coils 82$a$ are enabled for collection of data, each of the template data and the raw data corresponding to one slice includes data based on signals respectively output from the plurality of enabled surface coils 82$a$.

Figure 5:
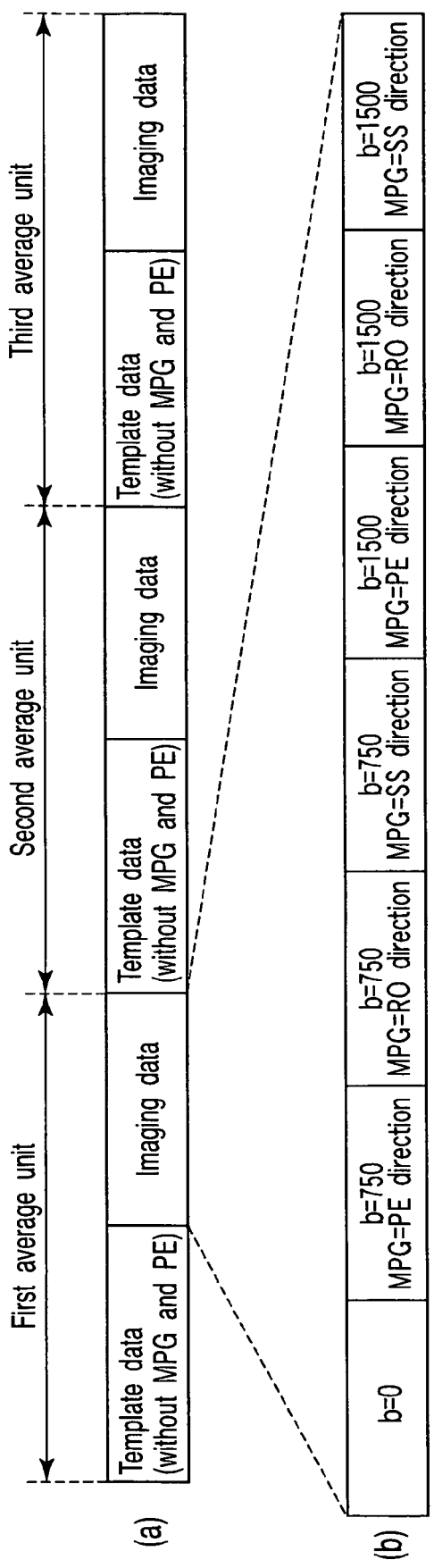
FIG. 5 is a timing chart showing another example of the procedure of collecting raw data in three average units.

FIG. 5 is a timing chart showing another example of the procedure of collecting raw data in three average units.

The procedure shown in FIG. 5 is different from the procedure depicted in FIG. 4 in a procedure of collecting raw data as imaging data in one average unit. That is, as shown by a chart (b) in FIG. 5, as imaging data, raw data is collected in a state where a b factor is set to "0". Then, the b factor is fixed to "750", and three types of raw data are collected while varying a direction of an MPG pulse to each of PE direction, RO direction, and SS direction. Furthermore, the b factor is fixed to "1500", three types of raw data are collected while varying the direction of the MPG pulse to each of PE direction, RO direction, and SS direction. Thus, as the imaging data, seven types of raw data are collected in total.

Figure 6:
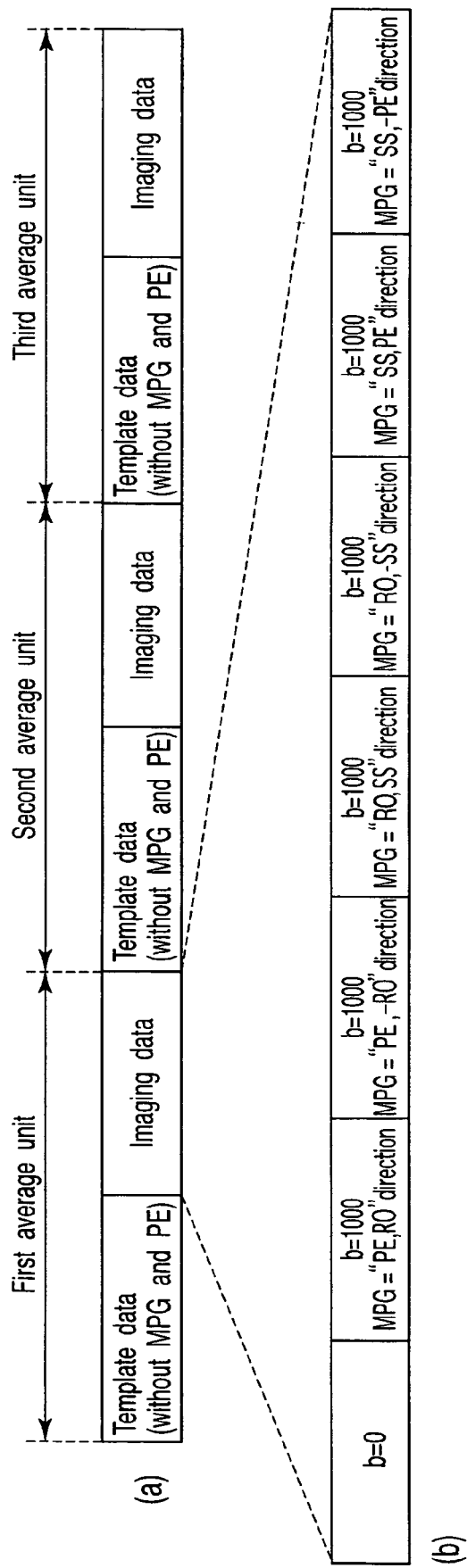
FIG. 6 is a timing chart showing still another example of the procedure of collecting raw data in three average units.

FIG. 6 is a timing chart showing still another example of the procedure of collecting raw data in three average units.

The procedure shown in FIG. 5 is different from the procedure depicted in FIG. 4 in a procedure of collecting raw data as imaging data in one average unit. That is, as shown by a chart (b) in FIG. 6, as imaging data, raw data is collected in a state where a b factor is set to "0". Then, the b factor is fixed to "1000", and six types of raw data are collected while varying a direction of an MPG pulse to each of "PE, RO" direction, "PE, −RO" direction, "RO, SS" direction, "RO, −SS" direction, "SS, PE" direction, and "SS, −PE" direction. Thus, as the imaging data, seven types of raw data are collected in total. In the vector representation of (PE direction, RO direction, SS direction), the dimension and direction of the MPG pulse used for collecting the six types of raw data are given as (b/2, b/2, 0), (b/2, −b/2, 0), (0, b/2, b/2), (0, b/2, −b/2), (b/2, 0, b/2) and (−b/2, 0, b/2).

It is to be noted that conditions and a collection number when collecting raw data as the imaging data can be changed in many ways. Moreover, collection of the raw data in the state where the b factor is set to "0" does not have to be carried out in all the average units, and it may be performed in, e.g., the first average unit alone.

In step Sa2, the host computer 16 calculates a phase difference $\Delta\theta$acq of each of the second average unit and the subsequent average units with respect to the first average unit. A calculation of the phase difference $\Delta\theta$acq is performed in accordance with each slice based on the template data. Further, when the plurality of surface coils 82$a$ are enabled to collect the template data, the calculation of the phase difference $\Delta\theta$acq is performed with respect to each data based on each signal acquired by the plurality of enabled surface coils 82$a$.

Figure 7:
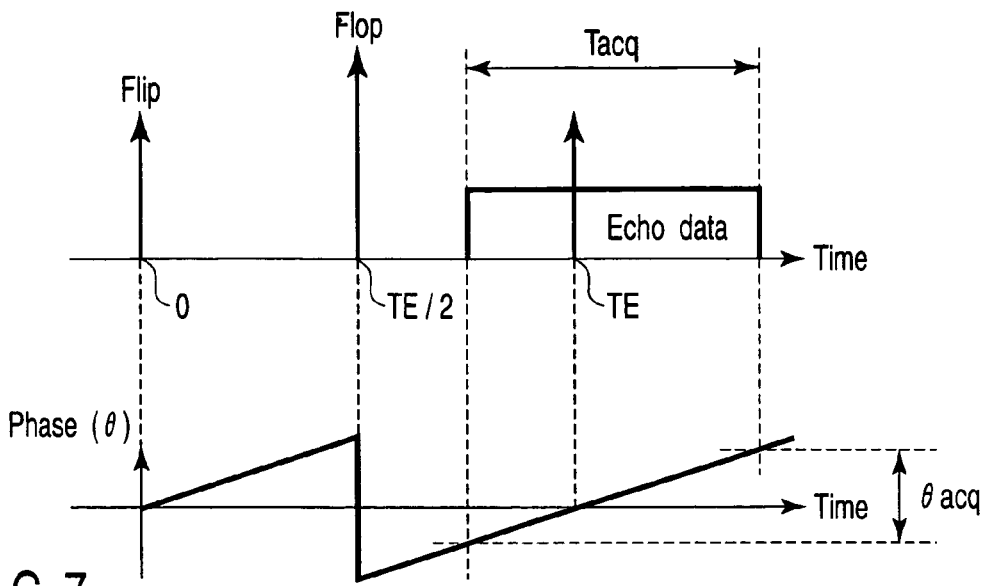
FIG. 7 is a view showing a transition of a phase of a magnetic resonance signal when acquiring template data.

When acquiring the template data, a phase of a magnetic resonance signal undergoes a transition as shown in FIG. 7. That is, the phase of the magnetic resonance signal gradually varies from the moment immediately after application of a flip pulse. When a time TE/2 passes from application of the flip pulse, the phase of the magnetic resonance signal is inverted by applying a flop pulse. As a result, when the time TE/2 further passes, i.e., when the time TE passes from application of the flip pulse, the phase is returned to the phase immediately after application of the flip pulse.

A rate of change in the phase of such a magnetic resonance signal differs depending on a magnitude of a $B_0$ shift. However, the phase when the time TE passes from application of the flip pulse becomes equal to the phase immediately after application of the flip pulse irrespective of the rate of change in the phase. Therefore, the phase when the time TE passes from application of the flip pulse is not affected by the $B_0$ shift, and the technology disclosed in JP-A 2005-270285 (KOKAI) cannot be applied.

Thus, the host computer 16 calculates $\Delta\theta$acq as a difference in phase variation in a period Tacq where echo data is acquired as the template data. The host computer 16 specifically executes such a calculation of $\Delta\theta$acq as follows.

Figure 8:
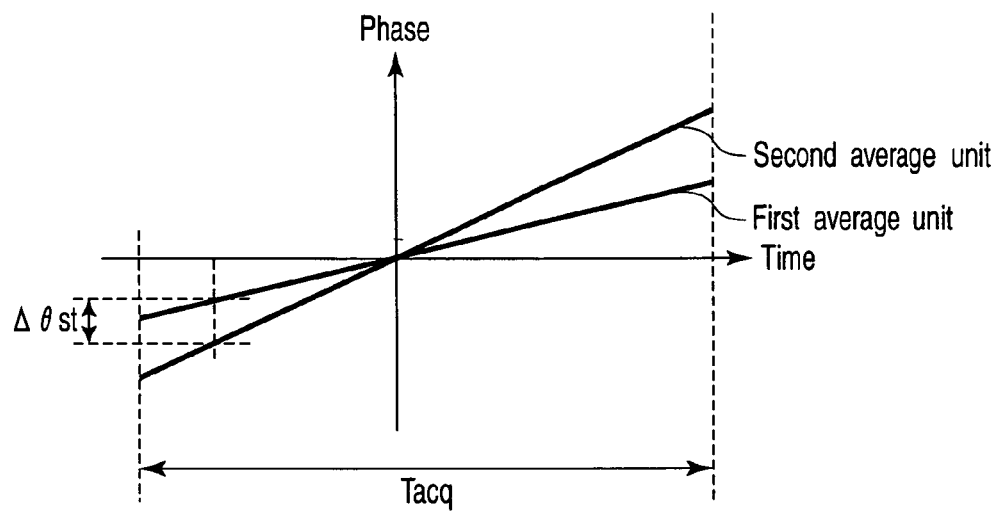
FIG. 8 is a view showing a phase difference Δθst calculated with respect to a given sampling timing.

First, the host computer 16 calculates a phase difference $\Delta\theta$st between a phase in the second average unit indicated by the template data and a phase in the first average unit indicated by the template data with respect to each of many sampling timings set in the period Tacq. For example, FIG. 8 shows the phase difference $\Delta\theta$st calculated in regard to a given sampling timing.

Furthermore, the host computer 16 calculates a phase difference $\Delta\theta$st' in each of third and subsequent average units based on the template data concerning each average unit and the template data concerning the previous average unit like the phase difference $\Delta\theta$st. Moreover, in regard to each of the third average unit and the subsequent average units, the host computer 16 adds $\Delta\theta$st calculated with respect to the previous average unit to $\Delta\theta$st' calculated with respect to the relevant average unit to calculate $\Delta\theta$st of the relevant average unit.

In this manner, the phase difference $\Delta\theta$st between each of the second and subsequent average units and the first average unit is calculated in accordance with each of the many sampling timings. It is to be noted that such a calculation of the phase difference $\Delta\theta$st can be executed by using a method of Ahn. It is to be noted that the method of Ahn is also explained in paragraphs 0095 to 0098 in JP-A 2005-270285 (KOKAI) in detail.

Figure 9:
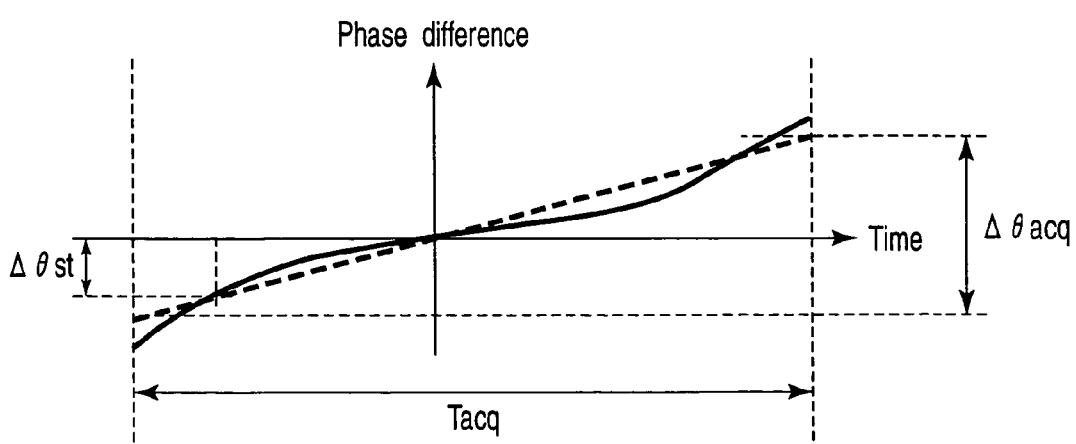
FIG. 9 is a view showing aged changes of many phase differences Δθst calculated in regard to the same average unit.

Aged changes of the many phase differences $\Delta\theta$st calculated with respect to the same average unit as explained above become nonlinear as indicated by a solid line in FIG. 9, for example. That is because phase changes are linearly shown in principle in FIG. 8, whereas actual phase changes include a movement of the subject 200, an eddy current, or an influence of noise to become nonlinear. In particular, the phase changes are apt to be greatly affected by an eddy current on the initial stage of the period Tacq, and they are apt to be greatly affected by noise on the terminal stage of the same since a level of the magnetic resonance signal is low. Thus, the host computer 16 executes linear fitting with respect to such actual phase changes of the magnetic resonance signal to correct each phase difference $\Delta\theta$st so that such linear aged changes as indicated by a broken line in FIG. 9 can be obtained. Then, as shown in FIG. 9, the host computer 16 calculates a phase difference $\Delta\theta$acp of one average unit with respect to the first average unit as a difference between the corrected phase difference Δθst at a start timing in the period Tacq and the corrected phase difference Δθst at an end timing in the same.

In step Sa3, the host computer 16 calculates a frequency difference Δfo in each of the second and subsequent average units with respect to the first average unit in accordance with each slice. This is performed by assigning Δθacp in each of the second and subsequent average units calculated in accordance with each slice or each utilized surface coil 82a to the following expression.

$$\Delta fo = \Delta \theta acq / Tacq$$

In step Sa4, the host computer 16 performs multi-coil correction. However, this multi-coil correction is carried out when the plurality of surface coils 82a are used to collect the template data. That is, when the plurality of surface coils 82a are used to collect the template data, the intensities (integral values) of the signals received by the surface coils 82a are different. Therefore, the host computer 16 determines weights of the surface coils 82a in such a manner that the greater the intensities of the signals output from the surface coils 82a are, the greater the weights are. Further, the host computer 16 applies the weight calculated with respect to each surface coil 82a to the frequency difference Δfo calculated for the same surface coil 82a, thereby calculating a weighted average. As a result, the single frequency difference Δfo subjected to multi-coil correction can be obtained per slice.

To be more specific, the weight W(i) of the i-th surface coil 82a is given by $$W(i) = \Sigma S(i,j)$$

where i is a number assigned to each of the surface coils 82a, j is a collection matrix number as determined in the RO direction, and S(i,j) is a signal intensity which the i-th surface coil 82a receives with respect to the j-th collection matrix.

The frequency difference Δfo is given by the following formula:

$$\Delta fo = \Sigma(W(i) \times \Delta f(i)) / \Sigma W(i)$$

This multi-coil correction is performed with respect to each of all slices.

In step Sa5, the host computer 16 smoothes the frequency difference Δfo of the same slice in each average unit in a time direction. That is, the host computer 16 corrects the frequency difference Δfo in each average unit in such a manner that changes in the plurality of frequency differences Δfo with respect to the same slice in the average unit order are approximated by a linear function. This smoothing in the time direction is executed with respect to each of all slices. Performing this smoothing in the time direction enables correcting an error caused due to, e.g., a movement of the subject or suddenly produced noise.

In step Sa6, the host computer 16 smoothes the frequency difference Δfo of each slice in the same average unit in a slice direction. That is, the host computer 16 corrects changes in the plurality of frequency differences Δfo in the same average unit in the slice direction by a weighting least square method or a moving-average method. It is to be noted that, as a weight, a sum total of signal intensities of the template data of each slice can be used, for example. Additionally, as a reference function when applying the least square method, a linear function or a quadratic function can be used. This smoothing in the slice direction is performed in each of the second and subsequent average units. When the subject is a living body, this smoothing in the slice direction enables correcting a measurement error that becomes large in a slice having a small area share ratio of the subject because of continuous occurrence of magnetic field non-uniformity in the slice direction.

As explained above, the frequency difference Δfo in each of the second and subsequent average units subjected to various kinds of corrections can be obtained in accordance with each slice.

In step Sa7, the host computer 16 transfers the corrected frequency difference Δfo obtained as explained above to the arithmetic unit 11, and instructs the arithmetic unit 11 to correct the imaging data. In response to this instruction, the arithmetic unit 11 corrects each imaging data concerning each of the second and subsequent average units to compensate a phase shift in a phase encoding direction corresponding to the frequency difference Δfo of the same slice in the same average unit.

In step Sa8, the host computer 16 instructs the arithmetic unit 11 to perform image reconstruction based on the corrected imaging data. In response to this instruction, the arithmetic unit 11 first reconstructs one image in accordance with each imaging data corresponding to one average unit and one slice. Further, the arithmetic unit 11 performs averaging in accordance with each of a plurality of images (an equal number of the average units) obtained in relation to the same slice, thereby acquiring one image per slice.

Since the image reconstructed based on the corrected imaging data has a corrected displacement involved by the $B_0$ shift, there is no displacement between images concerning the same slice respectively obtained in each average unit, thus acquiring excellent images by averaging.

This embodiment can be modified in many ways as follows.

(1) In fat suppression, a magnetic resonance signal from fat is suppressed by a saturation pulse associated with a frequency of the magnetic resonance signal from the fat. Therefore, when a fat suppression frequency is shifted due to an influence of the $B_0$ shift, the saturation pulse cannot suppress the magnetic resonance signal from the fat. Thus, a frequency difference Δfo concerning a relevant average unit is obtained like the above example every time collection of template data in one average unit is terminated, and this frequency difference Δfo is used to change a frequency of the saturation pulse that is applied when collecting imaging data in this average unit. Then, a fat suppression failure due to the $B_0$ shift can be reduced.

(2) When the frequency difference Δfo in a relevant average unit is obtained every time collection of the template data in one average unit is terminated, changing a center frequency of an RF pulse that is applied in accordance with this frequency difference at the time of collection of the imaging data in the relevant average unit enables reducing a displacement of an image. However, in the case where the position shift correction by the center frequency is used for image reconstruction, the imaging data must be corrected before image reconstruction while considering a variation of the center frequency.

(3) There may be performed imaging based on any other sequence where a load of a gradient coil is smaller than that in the SE-EPI sequence from a state where a temperature of an iron shim is increased because of execution of imaging based on the SE-EPI sequence or the FE-EPI sequence. In this case, a cooling function sufficiently demonstrates an effect so that a temperature of the iron shim may be possibly reduced during imaging. In such a case, the $B_0$ shift likewise occurs, and hence a correction like this embodiment is useful. That is, a sequence to which the above-explained correction is applied is not restricted to the SE-EPI sequence or the FE-EPI sequence.

(4) Execution of the various kinds of corrections and smoothing in the steps Sa4 to Sa6 may be omitted.

(5) The various kinds of corrections and smoothing in the steps Sa4 to Sa6 may be executed with respect to a phase difference calculated in the step Sa2.

(6) In the example shown by chart (b) in FIG. 4, an MPG pulse is applied in three directions, namely, PE direction, RO direction and SS direction (in four directions if the case where b=0 is added). The number of directions in which the MPG pulse is applied can be determined arbitrarily. For example, the number of directions of MPG pulse application can be 128. Where the number of directions is large, as in this case, it is not reasonable to acquire template data on all directions. Thus, the directions of MPG pulse application may be classified into several groups, and template data may be acquired for each of these groups. For example, where the directions of MPG application are 128 directions, they may be classified into eight groups, and template data may be acquired for each group made up of 16 directions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) apparatus comprising:
   an MRI data collecting unit which collects data for a plurality of average units, each average unit including template magnetic resonance (MR) data without performing phase encoding using switched gradient magnetic fields, and MR imaging data with phase encoding using switched gradient magnetic fields;
   a calculating unit which calculates a frequency difference between a resonant frequency in a reference average unit and an object average unit based on a phase variation of MR signals (a) in a period where the template data is collected in the reference average unit and (b) in a period where the template data is collected in the object average unit, wherein (i) if the number of average units is two, the reference average unit is one of the average units, and the object average unit is the other one of the average units, and (ii) if the number of average units is three or more, the reference average unit is one of the average units, and the object average unit is constituted by remaining ones of the average units;
   a correcting unit which corrects a $\Delta B_0$—induced phase shift in the direction of an applied phase encoding gradient magnetic field in image data collected in the object average unit constituted by one or more average units based on the frequency difference calculated for the average unit; and
   a reconstructing unit which reconstructs an image concerning the subject based on MR imaging data collected in the reference average unit and the MR imaging data of the object average unit constituted by one or more average units corrected by the correcting unit.

2. A magnetic resonance imaging apparatus comprising:
   an MRI collecting unit which collects data for a plurality of average units, each average unit including template magnetic resonance (MR) data without performing phase encoding using switched gradient magnetic fields, and MR imaging with phase encoding using switched gradient magnetic fields;
   a calculating unit which calculates a frequency difference between a resonant frequency in a reference average unit and an object average unit average unit based on a phase variation of the MR signals (a) in a period where the template data is collected in the reference average unit and (b) in a period where the template data is collected in the object average unit, wherein (i)if the number of average units is two, the reference average unit is one of the average units, and the object average unit is the other one of the average units, and (ii) if the average units is three or more, the reference average unit is one of the average units, and the object average unit is constituted by remaining ones of the average units;
   a correcting unit which corrects $\Delta B_0$—induced error in a center frequency of an excitation radio-frequency pulse that is applied to the subject to induce MR imaging data in the object average units based on the frequency difference calculated in the object average unit; and
   a unit which reconstructs an image of a subject based on the MR imaging data collected by the collecting unit.

3. The magnetic resonance imaging apparatus according to claim 2, wherein the calculating unit determines a difference between phases of two instances of template data at each of a plurality of sampling timings in a period from start of template data collection to end of template data collection, corrects aged changes in the difference based on linear fitting, then measures a phase difference as a variation of the difference in the corrected aged changes at each of the start and the end, and calculates the frequency difference based on the phase difference.

4. The magnetic resonance imaging apparatus according to claim 3, wherein:
   the collecting unit uses a plurality of coils that respectively receive magnetic resonance signals to acquire the template data and the imaging data, and
   the calculating unit measures the phase differences based on template data acquired by the plurality of coils, obtains a ratio of reception MR signal intensities in the plurality of coils, and calculates the frequency difference based on a phase difference obtained by performing weighted averaging with respect to the phase differences measured in relation to the plurality of coils in accordance with the ratio, or calculates the frequency difference by performing weighted averaging with respect to a plurality of frequency differences obtained in relation to the plurality of coils based on the phase differences measured with respect to the plurality of coils in accordance with the ratio.

5. The magnetic resonance imaging apparatus according to claim 3, wherein:
   the calculating unit (a) calculates the frequency difference based on respective phase differences obtained by smoothing over time the plurality of phase differences of the same slice respectively measured in the plurality of average units, or (b) calculates the frequency difference by smoothing over time a plurality of frequency differences respectively calculated based on the plurality of phase differences of the same slice respectively measured in the plurality of average units.

6. The magnetic resonance imaging apparatus according to claim 3, wherein:
   the calculating unit (a) calculates the frequency difference based on respective phase differences obtained by smoothing over slices a plurality of phase differences of a plurality of slices respectively measured in the same average unit, or (b) calculates the frequency difference by smoothing over slices a plurality of frequency differences calculated based on a plurality of phase differences of a plurality of slices respectively measured in the same average unit.

7. The magnetic resonance imaging apparatus according to claim 2, wherein:
the collecting unit transmits a fat suppression pulse at the time of acquiring the imaging data, and
the correcting unit changes a frequency of the fat suppression pulse in the second and subsequent average units based on the frequency difference calculated in relation to each average.

8. A magnetic resonance imaging (MRI) apparatus that images a subject based on a spin echo type echo planar method of selectively exciting a nuclear spin within a slice by simultaneously applying an excitation radio-frequency pulse and a slice-selection gradient magnetic field to the subject, then applying a refocusing radio-frequency pulse, subsequently applying a read-out gradient magnetic field in a direction parallel to the slice while switching more than once, and simultaneously statically applying a phase encoding gradient magnetic field in a direction parallel to the slice-selection gradient magnetic field and perpendicular to the read-out gradient magnetic field, the apparatus comprising:
an MRI data collecting unit which collects data for a plurality of average units, each average unit including collections of template data of the slice without applying the phase encoding gradient magnetic field, and collections of imaging data of the slice with application of the phase encoding gradient magnetic field;
a calculating unit which calculates a frequency difference between a resonant frequency in a reference average unit and an object average unit based on a phase variation of the MR signals(a) in a period where the template data is collected in the reference average unit and (b) in a period where the template data is collected in the object average unit, wherein (i)if the number of average units is two, the reference average unit is one of the average units, and the object average unit is the other one of the average units, and (ii) if the number of average units is three or more, the reference average unit is one of the average units, and the object average unit is constituted by remaining ones of the average units;
a correcting unit which corrects a $\Delta B_0$—induced phase shift produced in image data collected in the object average unit constituted by one or more average units in the direction of an applied phase encoding gradient magnetic field based on the frequency difference calculated in regard to the average unit; and
a reconstructing unit which reconstructs an image concerning the slice based on MR imaging data collected in the reference average unit and MR imaging data concerning the object average unit constituted by one or more average units corrected by the correcting unit.

9. A magnetic resonance imaging (MRI) apparatus that images a subject based on a spin echo type echo planar method of selectively exciting a nuclear spin within a slice by simultaneously applying an excitation radio-frequency pulse and a slice-selection gradient magnetic field to the subject, then applying a refocusing radio-frequency pulse, subsequently applying a read-out gradient magnetic field in a direction parallel to the slice while switching more than once, and simultaneously applying a phase encoding gradient magnetic field in a direction parallel to the slice-selection gradient magnetic field and perpendicular to the read-out gradient magnetic field, the apparatus comprising:
an MRI data collecting unit which collects data for a plurality of average units, each average unit including collections of template data of the slice without applying a phase encoding gradient magnetic field, and collections of imaging data of the slice with application of a phase encoding gradient magnetic field;
a calculating unit which calculates a frequency difference between a resonant frequency in a reference average unit and an object average unit based on a phase variation of MR signals (a) in a period where the template data is collected in the reference average unit and (b) in a period where the template data is collected in the object average unit, wherein (i)if the number of average units is two, the reference average unit is one of the average units, and the object average unit is the other one of the average units, and (ii) if the number of average units is three or more, the reference average unit is one of the average units, and the object average unit is constituted by remaining ones of the average units;
a correcting unit which corrects for $\Delta B_0$—induced error in a center frequency of an excitation radio-frequency pulse that is applied to the subject to induce MR imaging data in the object average units based on the frequency difference calculated in regard to the object average unit; and
a unit which reconstructs an image concerning the slice based on the MR imaging data collected by the collecting unit.

10. The magnetic resonance imaging apparatus according to claim 9, wherein:
the reconstructing unit reconstructs an image concerning the slice based on data obtained by performing weighted averaging with respect to the imaging data concerning each of the plurality of average units.

11. The magnetic resonance imaging apparatus according to claim 9, wherein:
collection of the imaging data is carried out based on diffusion weighted imaging by applying an motion probing gradient pulse in a plurality of directions before and after the refocusing radio-frequency pulse.

12. The magnetic resonance imaging apparatus according to claim 11, wherein:
the collecting unit collects the template data for each direction obtained by dividing application directions of the motion probing gradient pulse by a predetermined integer.

13. A magnetic resonance imaging (MRI) method of imaging a subject based on a magnetic resonance (MR) signal produced in the subject by applying a gradient magnetic field and a radio-frequency pulse to the subject in a static magnetic field, the method comprising:
collecting data for a plurality of average units, each average unit including template data based on MR signals produced in the subject (a) without performing phase encoding with switched gradient magnetic fields and without application of a motion probing gradient pulse, and (b) phase encoding using switched gradient magnetic fields;
calculating a frequency difference between a resonant frequency in a reference average unit and an object average unit based on a phase variation of the magnetic field (a) in a period where the template data is collected in the reference average unit and (b) in a period where the template data is collected in the object average unit, wherein (i) if the number of average units is two, the reference average unit is one of the average units, and the object average unit is the other one of the average units, and (ii) if the number of average units is three or more, the reference average unit is one of the average units, and the object average unit is constituted by remaining ones of the average units;

correcting a $\Delta B_0$—induced phase shift produced in image data collected in the object average unit in a phase encoding gradient magnetic field application direction based on the frequency difference calculated in the object average units; and reconstructing an image concerning the subject based on the MR imaging data collected in the reference average unit and the corrected imaging data concerning the object average unit constituted by one or more average units.

14. A magnetic resonance imaging (MRI) method comprising:

collecting data for a plurality of average units, each average unit including template data based on magnetic resonance (MR) signals produced with and without performing phase encoding using switched gradient magnetic fields;

calculating a frequency difference between a resonant frequency in a reference average unit and an object average unit based on a phase variation of the MR signals (a) in a period where the template data is collected in the reference average unit and (b) in a period where the template data is collected in the object average unit, wherein (i) if the number of average units is two, the reference average unit is one of the average units, and the object average unit is the other one of the average units, and (ii) if the number of average units is three or more, the reference average unit is one of the average units, and the object average unit is constituted by remaining ones of the average units;

correcting $\Delta B_0$—induced error in a center frequency of the excitation radio-frequency pulse that is applied to induce the MR imaging data in the object average units based on the frequency difference calculated in the object average unit; and reconstructing an image concerning the subject based on the MR imaging data collected by the collecting unit.

* * * * *